United States Patent
Desko et al.

(10) Patent No.: US 6,828,649 B2
(45) Date of Patent: Dec. 7, 2004

(54) SEMICONDUCTOR DEVICE HAVING AN INTERCONNECT THAT ELECTRICALLY CONNECTS A CONDUCTIVE MATERIAL AND A DOPED LAYER, AND A METHOD OF MANUFACTURE THEREFOR

(75) Inventors: John C. Desko, Wescosville, PA (US); Thomas J. Krutsick, Fleetwood, PA (US); Chung-Ming Hsieh, Wyomissing, PA (US); Brian E. Thompson, Sinking Spring, PA (US); Bailey Jones, Mohnton, PA (US); Steve Wallace, Fleetwood, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/140,616

(22) Filed: May 7, 2002

(65) Prior Publication Data

US 2003/0209776 A1 Nov. 13, 2003

(51) Int. Cl.[7] .................. H01L 29/00; H01L 21/331
(52) U.S. Cl. ................. 257/517; 257/510; 257/511; 257/512; 257/513; 438/348; 438/361; 438/430
(58) Field of Search .................. 257/505, 510, 257/511–513, 517, 520, 374, 378, 370, 372, 637, 554, 635, 576, 584, 588; 438/361, 348, 218, 219, 429, 430, 386, 3

(56) References Cited

U.S. PATENT DOCUMENTS

| | | | | | |
|---|---|---|---|---|---|
| 5,541,440 | A | * | 7/1996 | Kozai et al. | 257/513 |
| 5,565,697 | A | * | 10/1996 | Asakawa et al. | 257/347 |
| 5,811,871 | A | * | 9/1998 | Nakashima | 257/565 |
| 6,396,090 | B1 | * | 5/2002 | Hsu et al. | 257/242 |
| 6,458,647 | B1 | * | 10/2002 | Tews et al. | 438/246 |

FOREIGN PATENT DOCUMENTS

JP  01191472  * 8/1989

OTHER PUBLICATIONS

S. Wolf Silicon Processing for the VLSI era, vol. 2, pp 522–560.*

* cited by examiner

*Primary Examiner*—Donghee Kang (57) ABSTRACT

The present invention provides a semiconductor device, a method of manufacture therefor, and an integrated circuit including the same. In one advantageous embodiment, the semiconductor device includes a doped layer located over a semiconductor substrate, and an isolation trench located in the doped layer and having a dielectric layer located on a sidewall thereof. The semiconductor device may further include a conductive material located within the isolation trench and an interconnect that electrically connects the conductive material and the doped layer.

17 Claims, 10 Drawing Sheets

SEMICONDUCTOR DEVICE HAVING AN INTERCONNECT THAT ELECTRICALLY CONNECTS A CONDUCTIVE MATERIAL AND A DOPED LAYER, AND A METHOD OF MANUFACTURE THEREFOR

TECHNICAL FIELD OF THE INVENTION

The present invention is directed, in general, to a semiconductor device and, more specifically, to a semiconductor device having an interconnect that electrically connects a conductive material and a doped layer, a method of manufacture therefor, and an integrated circuit including the semiconductor device.

BACKGROUND OF THE INVENTION

Integrated circuits are well known and are extensively used in various present day technological devices and systems, such as sophisticated telecommunications and computer systems of all types. As the use of integrated circuits continues to grow, the demand for more inexpensive and improved integrated circuits also continues to rise. Thus, presently, an emphasis in the integrated circuit industry is to provide densely packed, faster devices at a competitive price.

Deep trench-isolation structures are currently being used to provide the requisite thermal and electrical isolation between the densely packed devices. More specifically, deep trench-isolation structures have found increased use in complementary bipolar processes using both vertical npn and vertical pnp bipolar transistors.

In one of those devices, for example the pnp bipolar device, the deep isolation trenches are vertically formed through various doped regions, specifically a p-type buried collector region, a lightly n-doped isolation tub, and a p-type substrate. After formation of the isolation trench, a dielectric material may be formed on the sidewalls and bottom surface of the isolation trench. The isolation trench could then be filled with an easy to deposit filler material, such as polysilicon.

A problem arises, however, with the above-mentioned device. Because the above-mentioned isolation structure includes a sidewall dielectric layer covered by polysilicon, an undesirable parasitic metal oxide semiconductor (MOS) device is formed. In one instance, the p-type buried collector and the p-type substrate would act as the source and drain, the n-doped isolation tub would act as the body of the MOS device, the polysilicon fill of the isolation trench would act as the gate and the trench sidewall dielectric layer would act as the gate oxide. If not properly engineered, the parasitic MOS device could detrimentally be turned on, or alternatively, cause a significant sub-threshold current from the buried collector to the substrate to arise.

The most notable approach for substantially preventing the parasitic MOS device includes replacing the polysilicon fill with a deposited/grown oxide. Although fixed oxide charges in the oxide fill can still affect the nearby silicon, the absence of a gate metal/polysilicon on a sidewall means the parasitic MOS device is substantially reduced.

A key disadvantage of using an oxide in place of the polysilicon, is the inability to completely fill the trench with the oxide. When a typical oxide deposition process is used, the oxide grows faster at the top of the trench and fills in with a gap deeper down in the trench. This gap, and inclusion of moisture and/or contaminants, may affect long-term reliability of the device.

In an alternative approach, one could dope the N-type isolation tub (isotub) with a heavier concentration of dopants. However, this approach lowers the breakdown voltage of the device, as well as increases the overall capacitance of the device. Unfortunately, lower breakdown voltages and increased capacitance lead to degradation in device performance.

Accordingly, what is needed in the art is a semiconductor device and a method of manufacture therefor that does not experience the problems experienced by the prior art semiconductor devices.

SUMMARY OF THE INVENTION

To address the above-discussed deficiencies of the prior art, the present invention provides a semiconductor device, a method of manufacture therefor, and an integrated circuit including the same. In one advantageous embodiment, the semiconductor device includes a doped layer located over a semiconductor substrate, and an isolation trench located in the doped layer and having a dielectric layer located on a sidewall thereof. The semiconductor device may further include a conductive material located within the isolation trench and an interconnect that electrically connects the conductive material and the doped layer. It is believed that the interconnect beneficially turns off a parasitic MOS device in the semiconductor device.

The foregoing has outlined, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
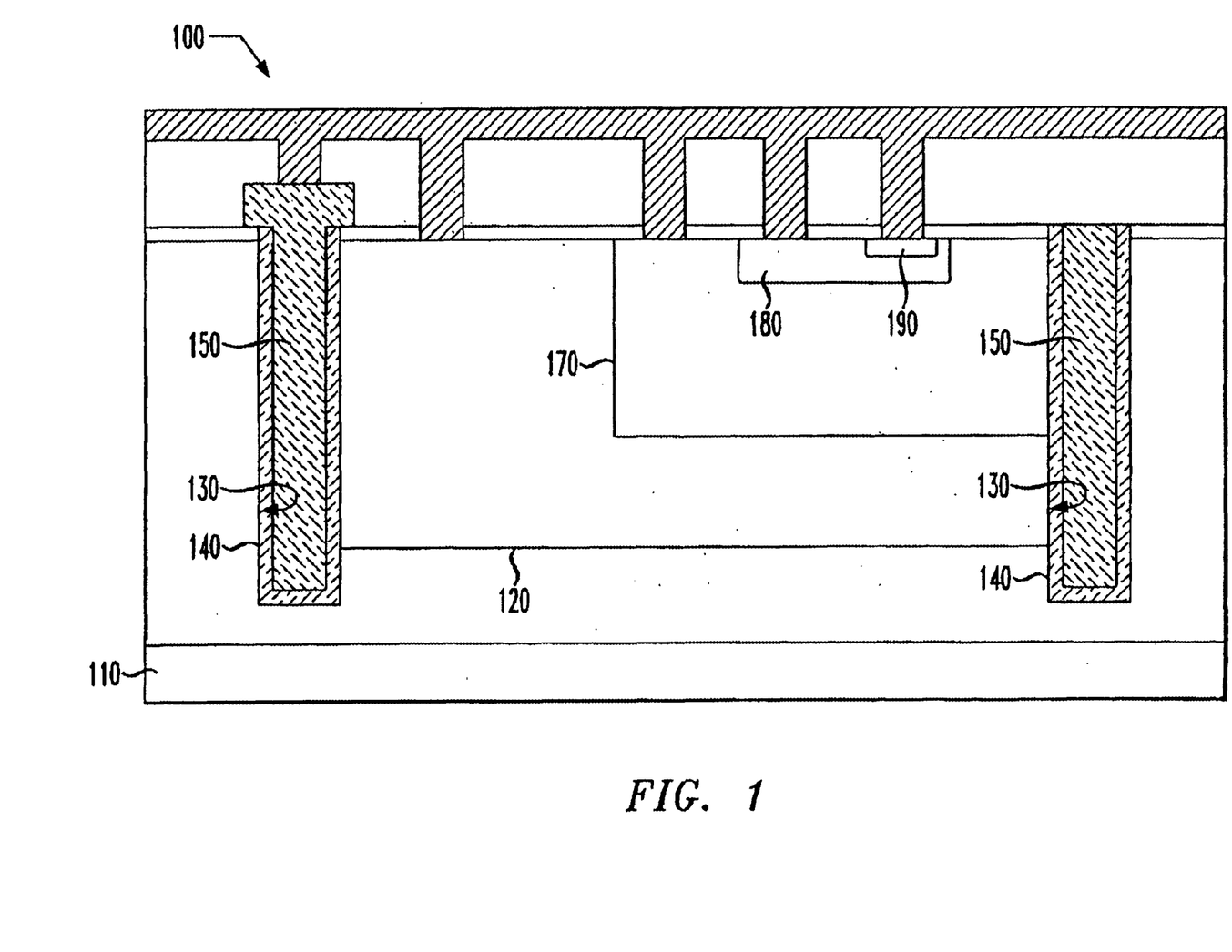
FIG. 1 illustrates one embodiment of a semiconductor device constructed in accordance with the principles of the present invention.

Referring initially to FIG. 1 illustrated is one embodiment of a semiconductor device, generally designated 100, constructed in accordance with the principles of the present invention. In the particular embodiment shown in FIG. 1, the semiconductor device 100 is a vertical pnp bipolar transistor. It should be noted, however, that the semiconductor device 100 may comprise various other devices while staying within the scope of the present invention.

As shown in FIG. 1, the semiconductor device 100 may include a doped layer 120 formed over a semiconductor substrate 110. In the illustrative embodiment shown, the doped layer 120 is an n-isolation tub for the vertical pnp bipolar transistor. One skilled in the art understands, however, that the doped layer 120 may be any doped layer located within the semiconductor device 110.

Located at least partially within the doped layer 120 is an isolation trench 130, the isolation trench 130 having a bottom surface and sidewalls. As illustrated, the isolation trench 130 may extend entirely through the doped layer 120. As further illustrated in FIG. 1, advantageously formed on the sidewall and bottom surface of the isolation trench 130 is a dielectric material layer 140.

The embodiment shown in FIG. 1, further includes a conductive material 150 located within the isolation trench 130, and over the dielectric material 140. The conductive material 150, which may comprise doped polysilicon or another conductive material, completely fills the isolation trench 130. In an exemplary embodiment, the conductive material 150 fills the isolation trench 130 in such a manner that no voids are formed therein.

As illustrated, the semiconductor device 100 further includes an interconnect 160 that electrically connects the conductive material 150 to the doped layer 120. The interconnect 160 may be any conventional interconnect. Preferably, the interconnect 160 may be formed during a preexisting process flow, at metal level one. The semiconductor device 100 further includes a collector 170, a base 180 and an emitter 190. While specific features of the semiconductor device 100 have been discussed, other features that are not shown nor discussed are, nonetheless, within the scope of the present invention.

Because the interconnect 160 electrically connects the conductive material 150 to the doped layer 120, any parasitic metal oxide semiconductor (MOS) devices are essentially turned off. For example, the doped layer 120 is typically held at a relatively high positive voltage so that it is reverse-biased with respect to the collector 170 and the substrate 110. Electrically connecting the high positive voltage doped layer 120 to the conductive material 150 provides that the electrical potential of the conductive material 150 is never below the electrical potential of the collector 160 and substrate 110. Therefore, the MOS device will generally never turn on.

While the embodiment shown in FIG. 1 has been discussed in detail, certain devices and structures have been omitted for clarity, or in the alternative, omitted for being a non-elected embodiment. For example, in one embodiment of the invention, conventional contact enhancements for sinker diffusions could be used.

Figure 2:
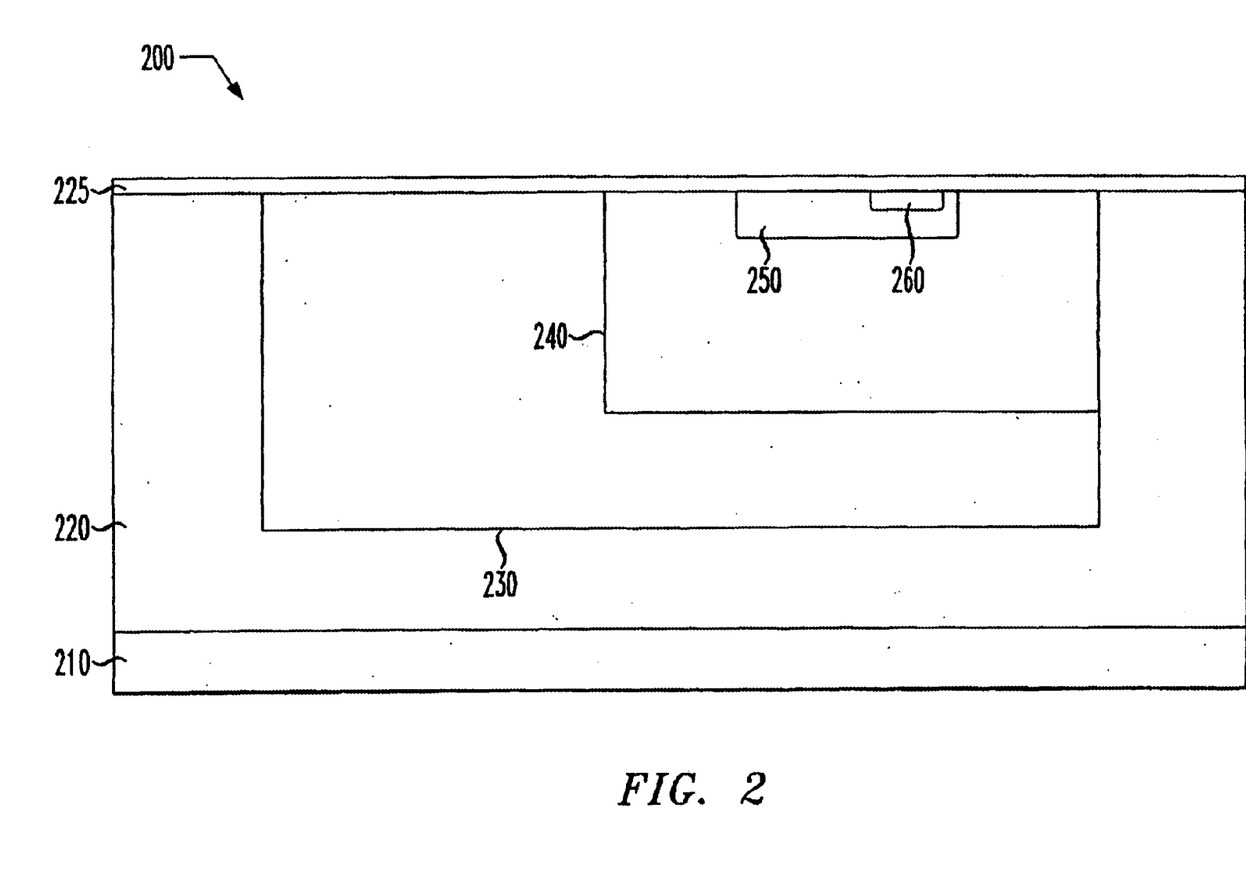
FIG. 2 illustrates a partially completed semiconductor device in accordance with the principles of the present invention.

Turning now to FIGS. 2–7, illustrated are detailed manufacturing steps depicting how one skilled in the art might manufacture the semiconductor device 100 illustrated in FIG. 1. FIG. 2 illustrates a partially completed semiconductor device 200 in accordance with the principles of the present invention. In the particular embodiment shown in FIG. 2, the semiconductor device 200 is a vertical pnp bipolar transistor. It should be noted, however, that while the remainder of the discussion will be with respect to the vertical pnp bipolar transistor, the novel aspects of the present invention may be used with any type of semiconductor device 200.

In the illustrative embodiment shown in FIG. 2, the semiconductor device 200 includes an epitaxial layer 220 located over a semiconductor substrate 210. The semiconductor substrate 210 may include any layer located in a semiconductor device 200, including a layer located at or anywhere above wafer level. The epitaxial layer 220 may be a conventional doped epitaxial layer.

The semiconductor device 200 illustrated in FIG. 2 further includes doped layer 230 formed over the semiconductor substrate 210, as well as within the epitaxial layer 220. In an exemplary embodiment, the doped layer 230 is an n-isolation tub for the vertical pnp bipolar transistor. The doped layer 230 may be formed using various conventional techniques, including using photoresist and a high energy implant to drive an n-type dopant, such as phosphorous, into the epitaxial layer 220. In an exemplary embodiment of the present invention, the doped layer 230 has a dopant concentration ranging from about 1E14 atoms/cm$^3$ to about 2E16 atoms/cm$^3$.

As further illustrated in FIG. 2, an oxide layer 225 may be located over the epitaxial layer 220. In an exemplary embodiment, the oxide layer 225 is formed in an effort to attempt to provide electrical isolation between the various layers in the semiconductor device 200. In one embodiment of the present invention, the oxide layer 225 is a conventionally formed sacrificial field oxide layer. Other materials, however, are within the scope of the present invention.

The partially completed semiconductor device 200 illustrated in FIG. 2 additionally includes a collector 240, a base 250, and an emitter 260. Similar to the doped layer 230, the collector 240, base 250 and emitter 260 may be formed using various conventional manufacturing techniques. In an exemplary embodiment of the present invention, the collector 240 is doped with a p-type dopant to a concentration ranging from about 5E18 atoms/cm$^3$ to about 2E19 atoms/cm$^3$. Additionally, the base 250 may be doped with an n-type dopant to a concentration ranging from about 5E17 atoms/cm$^3$ to about 5E18 atoms/cm$^3$, and the emitter may be doped with a p-type dopant to a concentration ranging from about 5E18 atoms/cm$^3$ to about 5E20 atoms/cm$^3$. Similar to many conventional vertical pnp bipolar transistors, the base 250 is formed within the collector 240, as well as the emitter 260 is formed within the base 250. While certain details have been given with respect to the manufacture of the semiconductor device 200 thus far, one skilled in the art understands that such steps are conventional.

Figure 3:
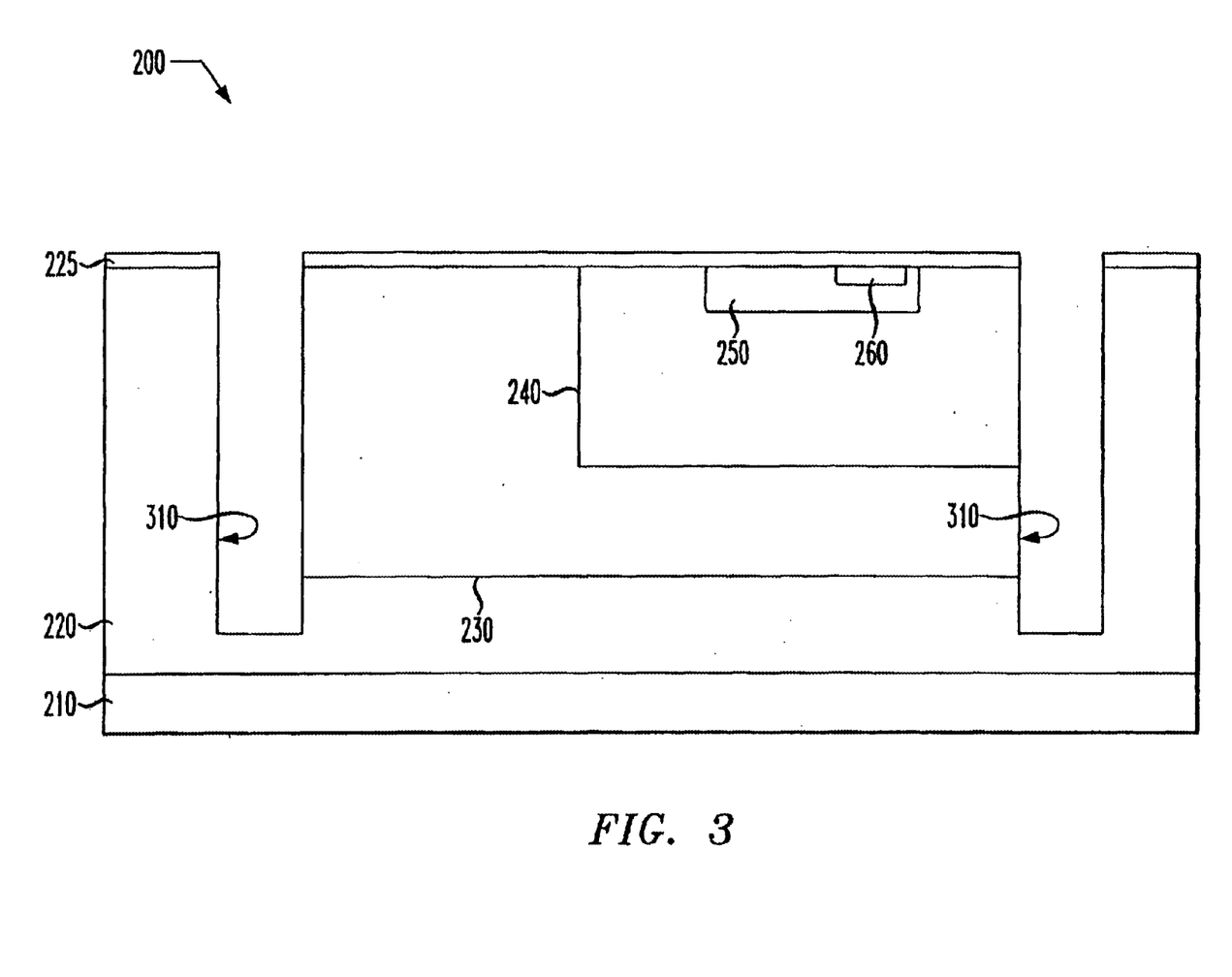
FIG. 3 illustrates the partially completed semiconductor device illustrated in FIG. 2, after formation of isolation trenches.

Turning now to FIG. 3, illustrated is the partially completed semiconductor device 200 illustrated in FIG. 2, after formation of isolation trenches 310. In the exemplary embodiment shown, the isolation trenches 310 are formed through the doped layer 230, and may have a width ranging from about 1.5 μm to about 2.0 μm and a depth ranging from about 6 μm to about 7 μm. Other locations, widths and depths are, however, within the scope of the present invention. It should be noted that conventional techniques may be used to form the isolation trenches 310, including using photoresist and a wet or dry etching process.

Figure 4:
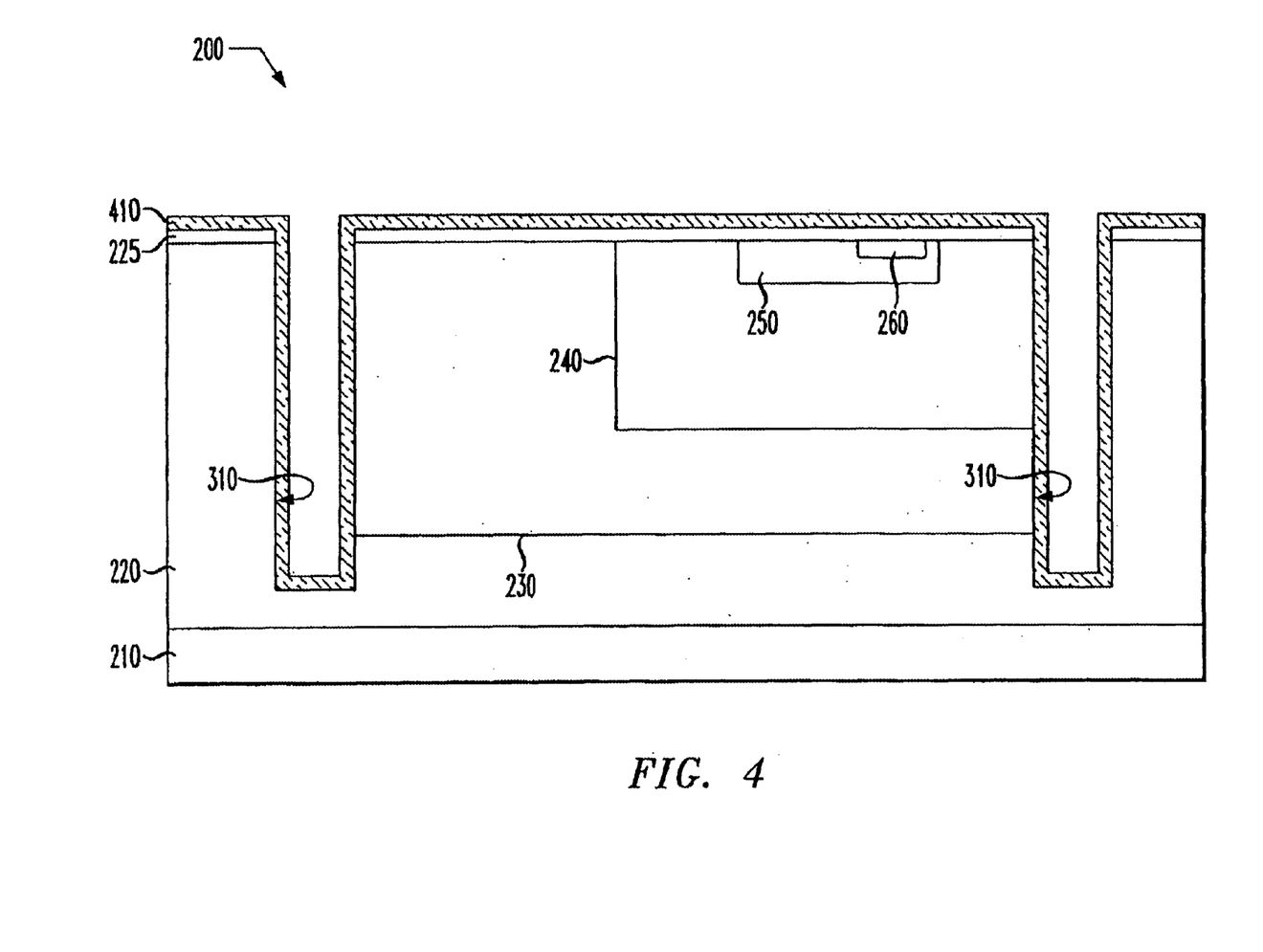
FIG. 4 illustrates the partially completed semiconductor device illustrated in FIG. 3, after formation of a blanket layer of dielectric material.

Turning to FIG. 4, illustrated is the partially completed semiconductor device 200 illustrated in FIG. 3, after formation of a blanket layer of dielectric material 410. As shown, the dielectric material 410 may be located on the surface of the epitaxial layer 220, as well as along the sidewall and bottom surface of the isolation trenches 310. As also shown, the layer of dielectric material 410 may comprise a single layer. It should be noted, however, that the layer of dielectric material 410 may comprise multiple layers (not shown), each layer having a specific function. For example, one layer could be an adhesion layer.

In the illustrative embodiment shown in FIG. 4, the dielectric material 410 comprises an oxide. Alternatively, however, the dielectric material may comprise a material selected from the group of materials consisting of silicon dioxide, silicon nitride, silicon oxynitride, low-dielectric constant materials (e.g., those having a dielectric constant less than or equal to about 2.0), as well as various other dielectric materials.

The dielectric material 410 may be formed using various well-known processes, depending on the particular material chosen. For example, if the dielectric material 410 is an oxide, the oxide may be either thermally grown and/or deposited using a chemical vapor deposition (CVD) process from TEOS or another vapor reactant.

The dielectric material 410 may, additionally, be formed having various thicknesses. While the dielectric material 410 thickness is very much dependent on the dopant dose used to form the doped layer 230, in an exemplary embodiment shown, the thickness of the dielectric material 410 ranges from about 80 nm to about 200 nm. Regardless of the thickness chosen for the dielectric material 410, the quality of the dielectric material 410 along the isolation trench 310 sidewall needs to be high. This is because the quality of the oxide-silicon interface may negatively affect the subthreshold current of the semiconductor device 200. Certain manufacturing steps may be taken to assure a higher quality interface, including a brief thermal oxidation step.

Figure 5:
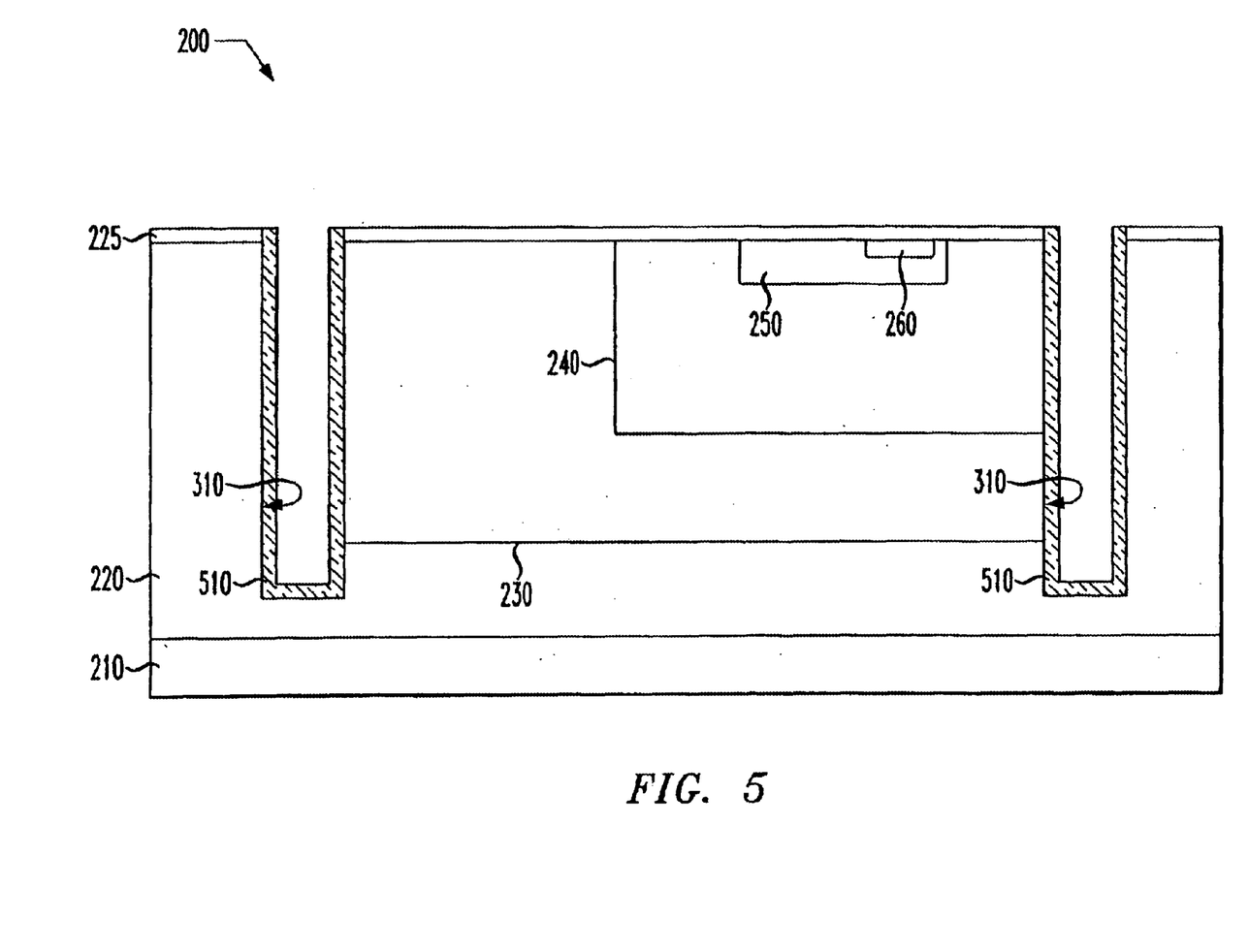
FIG. 5 illustrates the partially completed semiconductor device illustrated in FIG. 4, after removal of the dielectric material from an epitaxial layer surface.

Turning now to FIG. 5, illustrated is the partially completed semiconductor device 200 illustrated in FIG. 4, after removal of the dielectric material 410 from the epitaxial layer 220 surface. In this exemplary embodiment, this removal step leaves a dielectric layer 510 on the sidewall and bottom surface of the isolation trenches 310. However, in an alternative embodiment, at least a portion of the dielectric layer 510 may remain on the top surface of the epitaxial layer 220. In such an embodiment, the remaining dielectric layer 510 may provide additional electrical insulation between the epitaxial layer 220 and layers located thereover.

In an exemplary embodiment, the dielectric material 410 is removed using a conventional isotropic etch, using for example, a plasma etch or reactive ion etching (RIE) system. One skilled in the art, however, understands what steps need to be taken to remove the dielectric material 410 from all surfaces except those within the isolation trench 310, including using photoresist to protect the surfaces of the isolation trenches 310.

Other manufacturing steps (not shown) may be performed on the semiconductor device 200 illustrated in FIG. 5. For example, in an exemplary embodiment of the present invention, the dielectric material 140 could be removed from the bottom of the isolation trench 310. Subsequent thereto, a doped region could be implanted in the bottom of the trench and a second dielectric layer be regrown or redeposited over the doped region. This embodiment may optimally be used when one desires to reduce the amount of leakage current the exists between adjacent devices.

Figure 6:
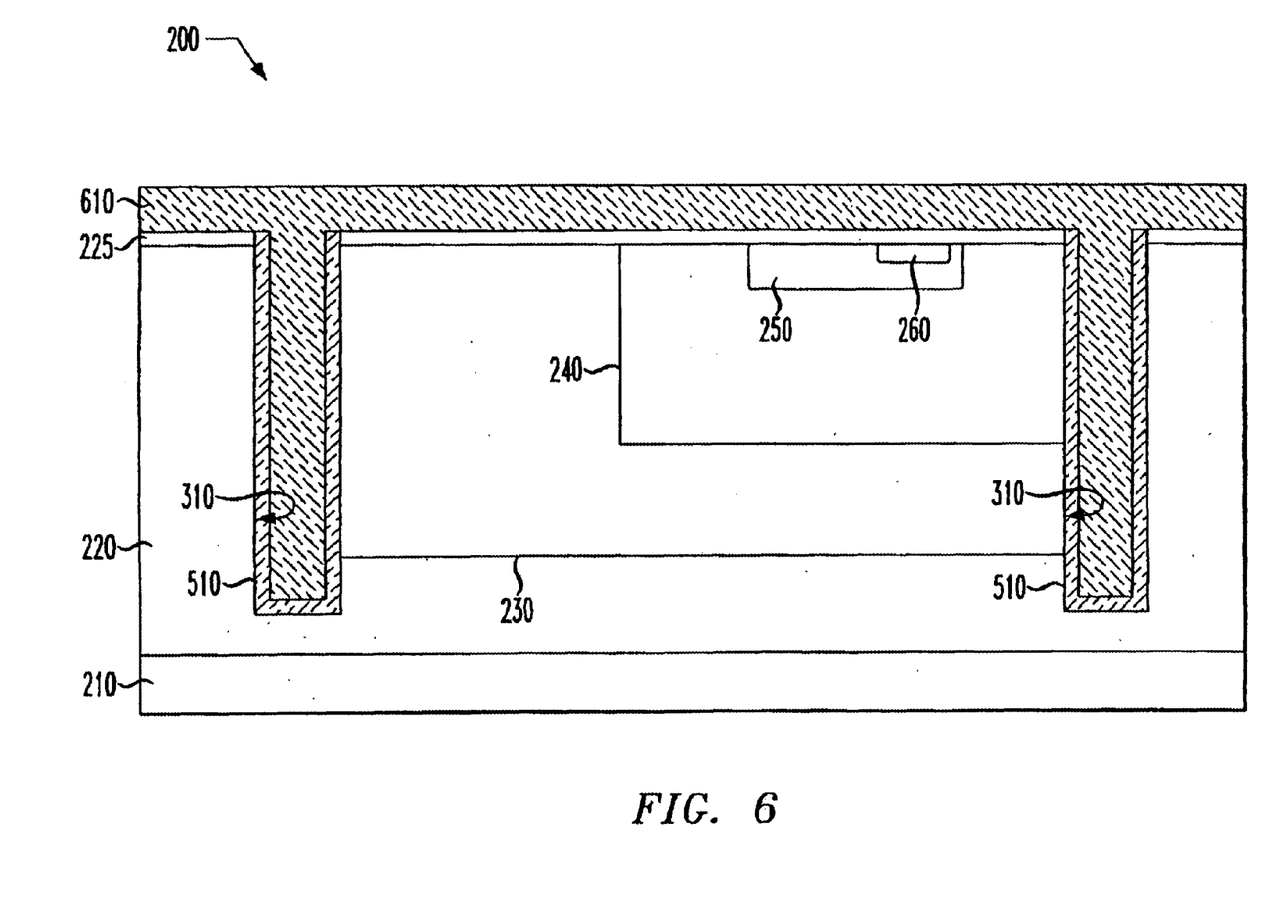
FIG. 6 illustrates the partially completed semiconductor device illustrated in FIG. 5, after formation of a conductive material layer within the isolation trenches.

Turning now to FIG. 6, illustrated is the partially completed semiconductor device 200 illustrated in FIG. 5, after formation of a conductive material layer 610 within the isolation trenches 310. In the illustrative embodiment shown, the conductive material layer 610 is conformally deposited over the epitaxial layer 220 as well as over the dielectric layer 510.

The conductive material layer 610, in an exemplary embodiment, comprises undoped polysilicon that has a surface implant with an implant dose ranging from about 1E15 atoms/cm$^2$ to about 1E16 atoms/cm$^2$. It should be noted, however, that the conductive material layer 610 may be doped by other means, such as in-situ doping of polysilicon. In such an example, the polysilicon might have a dopant concentration ranging from about 1E13 atoms/cm$^3$ to about 1E20 atoms/cm$^3$. Alternatively, the conductive material layer 610 may comprise other conductive materials, such as a material selected from the group consisting of tungsten, molybdenum, aluminum, copper or another similar material.

It should be noted that the conductive material layer 610 may be formed using conventional processes. A key aspect of the present invention, though, is to choose the manufacturing processes such that substantially no voids are present within the conductive material layer 610.

Figure 7:
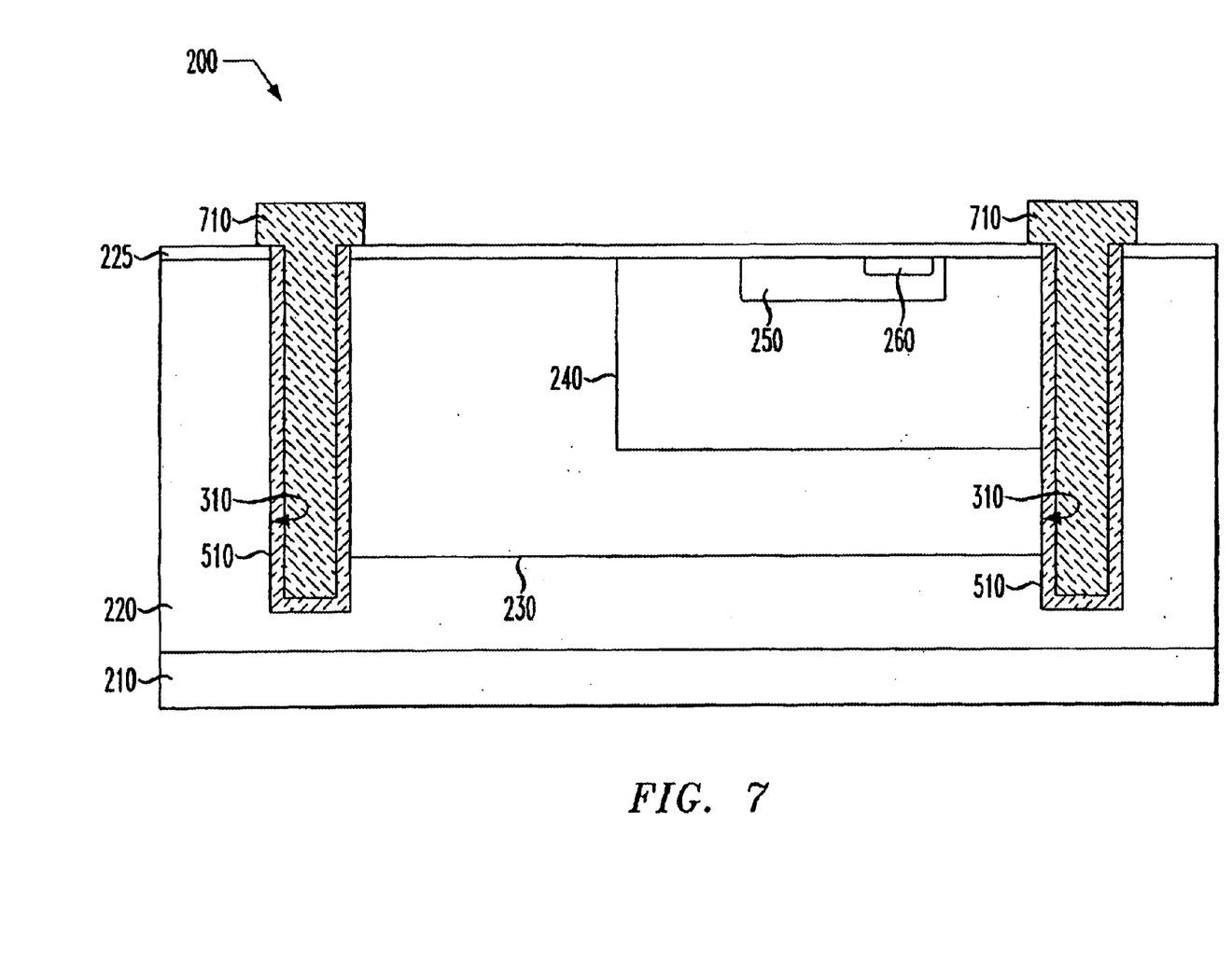
FIG. 7 illustrates the partially completed semiconductor device illustrated in FIG. 6, after removing a portion of the conductive material layer, and therefore, forming conductive material plugs.

Turning now to FIG. 7, illustrated is the partially completed semiconductor device 200 illustrated in FIG. 6, after removing a portion of the conductive material layer 610, and therefore, forming conductive material plugs 710. One skilled in the art understands how to pattern the conductive material layer 610, thus, a detailed discussion is not warranted. It should be pointed out, however, that in one particularly advantageous embodiment, the conductive material layer 610 is patterned such that it has a broad point of contact above the isolation trench 310.

Figure 8:
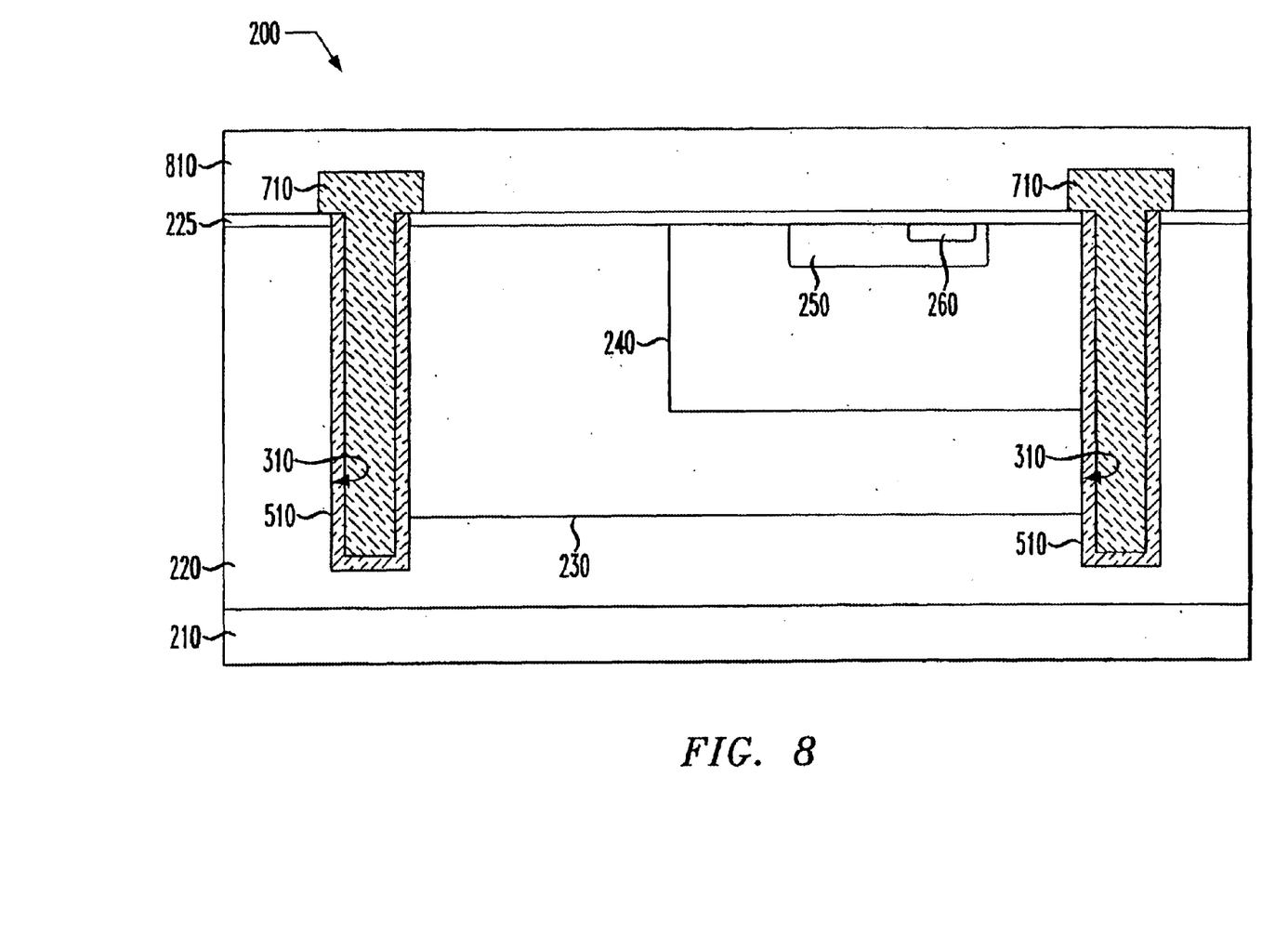
FIG. 8 illustrates the partially completed semicondcutor device illustrated in FIG. 7, after formation of an interlevel dielectric layer thereover.

Turning now to FIG. 8, illustrated is the partially completed semiconductor device 200 illustrated in FIG. 7, after formation of an interlevel dielectric layer 810 thereover. The interlevel dielectric layer 810, which may comprise any known or hereafter discovered dielectric material, is conventionally formed over the entire surface of the semiconductor device 200.

Figure 9:
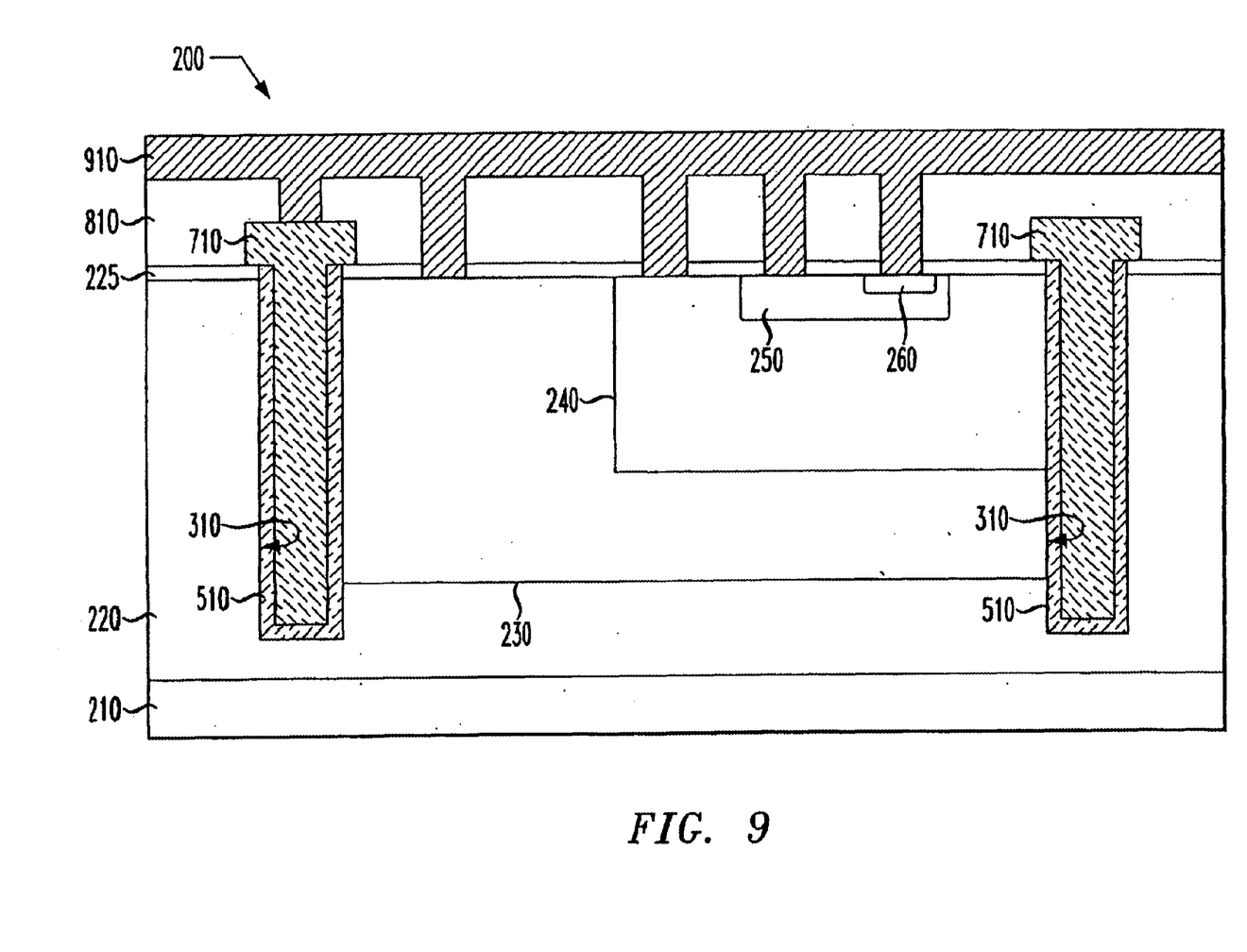
FIG. 9 illustrates the partially completed semiconductor device illustrated in FIG. 8, after patterning the interlevel dielectric layer, and formation of a first metal contact layer.

Turning to FIG. 9, illustrated is the partially completed semiconductor device 200 illustrated in FIG. 8, after patterning the interlevel dielectric layer 810 and formation of a first metal contact layer 910. As illustrated, the first metal contact layer 910 is formed such that it contacts both the conductive material plug 710 as well as the doped layer 230. The first metal contact layer 910 also contacts various other structures of the semiconductor device 200, including the collector 240, base 250 and emitter 260. The first metal contact layer 910 may comprise a variety of different materials, the most desirable of which is least resistive. After completion of the first metal contact layer 910, the first metal contact layer 910 may be subjected to a conventional etching process, resulting in a device similar to the semiconductor device 100 illustrated in FIG. 1.

Figure 10:
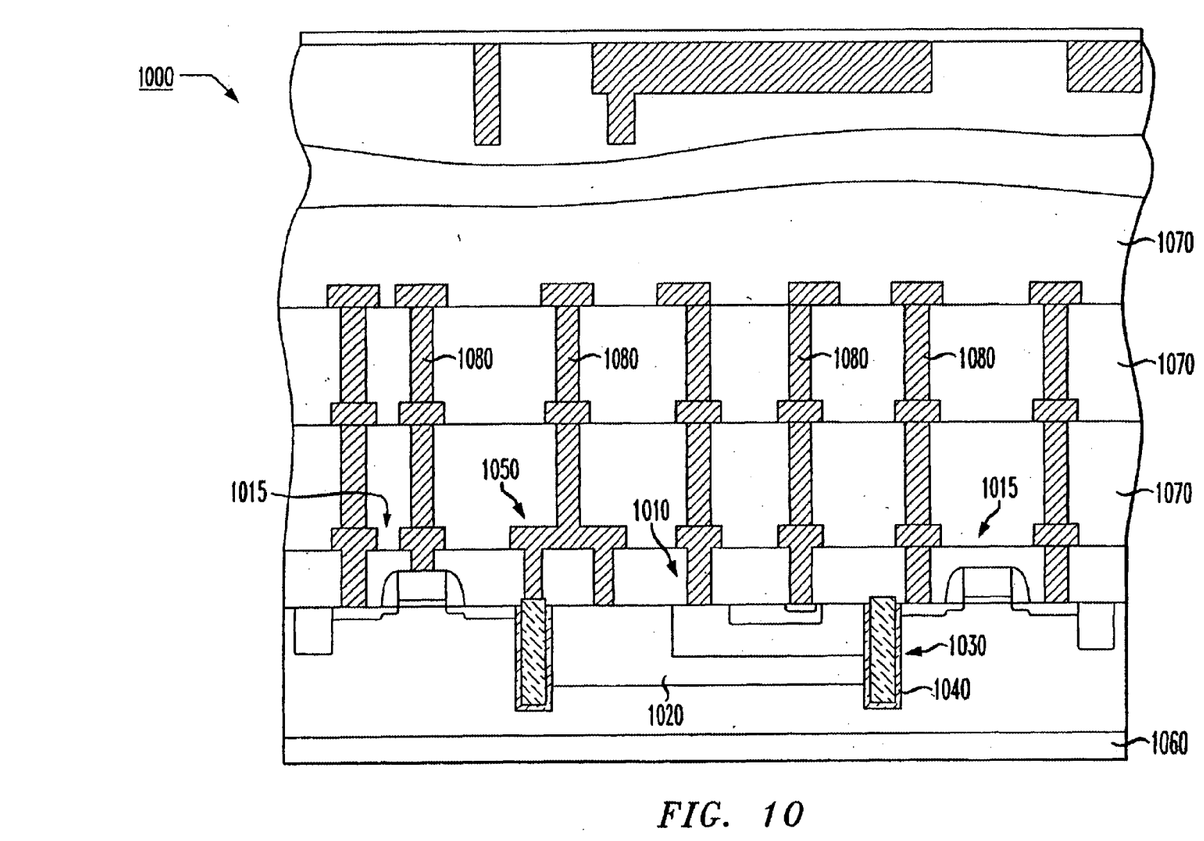
FIG. 10 illustrates a sectional view of a conventional integrated circuit (IC), incorporating a semiconductor device similar to the completed semiconductor device illustrated in FIG. 1.

Referring finally to FIG. 10, illustrated is a sectional view of a conventional integrated circuit (IC) 1000, incorporating a semiconductor device 1010 similar to the completed semiconductor device 100 illustrated in FIG. 1. The IC 1000 may also include active devices, such as Bipolar devices, BiCMOS devices, memory devices, or other types of active devices. The IC 1000 may further include passive devices, such as inductors or resistors, or it may also include optical devices or optoelectronic devices. Those skilled in the art are familiar with these various types of devices and their manufacture.

In the particular embodiment illustrated in FIG. 10, the IC 1000 includes a semiconductor device 1010, which is in the form of a vertical pnp bipolar transistor, as well as MOS devices 1015. As illustrated, the semiconductor device 1010 includes a doped layer 1020, isolation trenches 1030 having a conductive material 1040 formed therein, and an interconnect 1050 that electrically connects the conductive material 1040 and the doped layer 1020. As illustrated, all of the aforementioned elements are located over a semiconductor substrate 1060. The IC 1000 further includes dielectric layers 1070 located over the semiconductor device 1010 and MOS devices 1015. Additionally, interconnect structures 1080, are located within the dielectric layers 1070, contacting the semiconductor device 1010 and MOS devices 1015 to form the operational integrated circuit 1000.

Although the present invention has been described in detail, those skilled in the art should understand that they can make various changes, substitutions and alterations herein without departing from the spirit and scope of the invention in its broadest form.

What is claimed is:

1. A semiconductor device, comprising:
   a doped region doped with a first type dopant located in an epitaxial layer and over a semiconductor substrate;
   a collector region doped with a second type dopant opposite from the first type dopant and located within the doped region;
   an isolation trench located at least partially in the doped region and having a dielectric layer located on a sidewall thereof, the doped region located between the collector region and the isolation trench;
   a conductive material located within the isolation trench;
   a dielectric layer located over the isolation trench; and
   an interconnect located in the dielectric layer and contacting the conductive material and the doped region.

2. The semiconductor device as recited in claim 1 wherein the conductive material comprises a material selected from the group consisting of tungsten, molybdenum, aluminum, or copper.

3. The semiconductor device as recited in claim 1 wherein the conductive material comprises polysilicon.

4. The semiconductor device as recited in claim 3 wherein the polysilicon has a dopant concentration ranging from about 1E13 atoms/cm$^3$ to about 1E20 atoms/cm$^3$.

5. The semiconductor device as recited in claim 1 wherein the interconnect is located at a first metal level.

6. The semiconductor device as recited in claim 1 wherein the dielectric layer has a thickness ranging from about 10 nm to about 200 nm.

7. A method of manufacturing a semiconductor device, comprising:
   providing a doped region doped with a first dopant in an epitaxial layer and over a semiconductor substrate;
   forming a collector region with a second dopant opposite to the first dopant and within the doped region;
   creating an isolation trench at least partially in the doped region, the doped region located between the collector region and the isolation trench;
   forming a dielectric layer on a sidewall thereof;
   placing a conductive material within the isolation trench;
   forming a dielectric layer over the isolation trench; and
   electrically connecting the conductive material and the collector region by an interconnect located in the dielectric layer over the isolation trench.

8. The method as recited in claim 7 wherein placing a conductive material includes placing a conductive material selected from the group consisting of tungsten, molybdenum, aluminum, or copper.

9. The method as recited in claim 7 wherein placing a conductive material includes placing a conductive material comprising polysilicon.

10. The method as recited in claim 9, wherein the polysilicon has a dopant concentration ranging from about 1E13 atoms/cm$^3$ to about 1E20 atoms/cm$^3$.

11. The method as recited in claim 7 wherein electrically connecting includes electrically connecting using an interconnect located at a first metal level.

12. The method as recited in claim 7 wherein forming a dielectric layer includes forming a dielectric layer having a thickness ranging from about 10 nm to about 200 nm.

13. An integrated circuit, comprising:
   doped regions doped with a first dopant located in an epitaxial layer and over a semiconductor substrate;
   collector regions doped with a second dopant opposite to the first dopant wherein each of the collector regions is located within one of the doped regions;
   an isolation structure located at least partially in the each of the doped regions, the doped region located between the collector region and the isolation structure and, including;
   a dielectric layer located on a sidewall of an isolation trench; and
   a conductive material located within the isolation trench;
   transistors located over each of the collector regions; and
   interconnects located within an interlevel dielectric layer located over the transistors, which electrically connect the conductive material to one of the collector regions and further connect the transistors to form an operational integrated circuit.

14. The integrated circuit as recited in claim 1 wherein the conductive material comprises polysilicon.

15. The integrated circuit as recited in claim 14 wherein the polysilicon has a dopant concentration ranging from about 1E13 atoms/cm$^3$ to about 1E20 atoms/cm$^3$.

16. The integrated circuit as recited in claim 13 wherein the at least one of the transistors is a vertical pnp bipolar transistor.

17. The integrated circuit as recited in claim 13 wherein the isolation structure is located between a bipolar and a non-bipolar transistor.

* * * * *